United States Patent
Shallal et al.

(10) Patent No.: US 11,776,627 B2
(45) Date of Patent: Oct. 3, 2023

(54) MEMORY MODULE FOR PLATFORM WITH NON-VOLATILE STORAGE

(71) Applicant: Rambus Inc., San Jose, CA (US)

(72) Inventors: Aws Shallal, Cary, NC (US); Nigel Alvares, Thousand Oaks, CA (US); Sarvagya Kochak, San Ramon, CA (US)

(73) Assignee: Rambus Inc., San Jose, CA (US)

( * ) Notice: Subject to any disclaimer, the term of this patent is extended or adjusted under 35 U.S.C. 154(b) by 89 days.

(21) Appl. No.: 17/573,456

(22) Filed: Jan. 11, 2022

(65) Prior Publication Data
US 2022/0208267 A1    Jun. 30, 2022

Related U.S. Application Data

(63) Continuation of application No. 17/066,283, filed on Oct. 8, 2020, now Pat. No. 11,322,203, which is a (Continued)

(51) Int. Cl.
*G06F 12/0804* (2016.01)
*G11C 14/00* (2006.01)
(Continued)

(52) U.S. Cl.
CPC ...... *G11C 14/0018* (2013.01); *G06F 12/0804* (2013.01); *G06F 2212/1032* (2013.01); *G11C 11/4076* (2013.01); *G11C 11/4093* (2013.01)

(58) Field of Classification Search
CPC ............ G11C 14/0018; G11C 11/4076; G11C 11/4093; G06F 12/0804; G06F 2212/1032
(Continued)

(56) References Cited

U.S. PATENT DOCUMENTS 7,143,236 B2    11/2006   Pomaranski et al.
7,554,855 B2    6/2009    Kim
(Continued)

FOREIGN PATENT DOCUMENTS

WO    WO-2016-130163 A1    8/2016

OTHER PUBLICATIONS

Notification of Transmittal of the International Search Report and the Written Opinion of the International Searching Authority, or the Declaration with dated Feb. 9, 2018 re: Int'l Appln. No. PCT/US17/062645. 13 Pages.

*Primary Examiner* — Ly D Pham
(74) *Attorney, Agent, or Firm* — Fenwick & West LLP (57) ABSTRACT

A system that includes a non-volatile memory subsystem having non-volatile memory. The system also includes a plurality of memory modules that are separate from the non-volatile memory subsystem. Each memory module can include a plurality of random access memory packages where each first random access memory package includes a primary data port and a backup data port. Each memory module can include a storage interface circuit coupled to the backup data ports of the random access memory packages. The storage interface circuit offloads data from the memory module in the event of a power loss by receiving data from the backup data ports of the random access memory packages and transmitting the data to the non-volatile memory subsystem.

20 Claims, 4 Drawing Sheets

Related U.S. Application Data continuation of application No. 16/467,619, filed as application No. PCT/US2017/062645 on Nov. 20, 2017, now Pat. No. 10,839,904.

(60) Provisional application No. 62/486,438, filed on Apr. 17, 2017, provisional application No. 62/432,509, filed on Dec. 9, 2016.

(51) Int. Cl.
  *G11C 11/4076* (2006.01)
  *G11C 11/4093* (2006.01)

(58) Field of Classification Search
  USPC .................................................. 365/185.08
  See application file for complete search history.

(56) References Cited

U.S. PATENT DOCUMENTS

| | | | |
|---|---|---|---|
| 7,761,623 B2 | 7/2010 | Karamcheti et al. | |
| 7,761,624 B2 | 7/2010 | Karamcheti et al. | |
| 8,037,380 B2 | 10/2011 | Cagno et al. | |
| 8,189,328 B2 | 5/2012 | Kanapathippillai et al. | |
| 8,296,496 B2 | 10/2012 | Mogul et al. | |
| 8,656,072 B2 | 2/2014 | Hinkle et al. | |
| 8,861,277 B1 | 10/2014 | Rategh et al. | |
| 8,904,098 B2 | 12/2014 | Amidi et al. | |
| 9,098,209 B2 | 8/2015 | Gopalakrishnan et al. | |
| 9,195,542 B2 | 11/2015 | McKelvie et al. | |
| 9,250,999 B1 | 2/2016 | Barroso | |
| 9,280,497 B2 | 3/2016 | Berke et al. | |
| 9,342,423 B2 | 5/2016 | Judd | |
| 9,436,600 B2 | 9/2016 | Lee | |
| 9,460,791 B1 | 10/2016 | Shallal et al. | |
| 10,198,350 B2 | 2/2019 | Lee | |
| 10,241,727 B1 * | 3/2019 | Shallal | G06F 11/14 |
| 10,839,904 B2 | 11/2020 | Shallal et al. | |
| 2003/0016040 A1 | 1/2003 | Brunelle et al. | |
| 2007/0041264 A1 | 2/2007 | Cohen | |
| 2008/0160913 A1 | 7/2008 | Gardus | |
| 2010/0008175 A1 | 1/2010 | Sweere et al. | |
| 2010/0080057 A1 | 4/2010 | Reuter et al. | |
| 2013/0067156 A1 | 3/2013 | Cho | |
| 2014/0201431 A1 | 7/2014 | Woo | |
| 2014/0281661 A1 | 9/2014 | Milton et al. | |
| 2014/0337589 A1 | 11/2014 | Carpenter et al. | |
| 2014/0365715 A1 | 12/2014 | Lee | |
| 2016/0071552 A1 | 3/2016 | Ohwada et al. | |
| 2016/0342487 A1 | 11/2016 | Ware et al. | |
| 2018/0024768 A1 | 1/2018 | Nguyen et al. | |

* cited by examiner

MEMORY MODULE FOR PLATFORM WITH NON-VOLATILE STORAGE

CROSS-REFERENCE TO RELATED APPLICATIONS

This application is a continuation of U.S. patent application Ser. No. 17/066,283 filed on Oct. 8, 2020 which is a continuation of U.S. patent application Ser. No. 16/467,619 filed on Jun. 7, 2019, now U.S. Pat. No. 10,839,904, which is a 35 U.S.C. 371 patent application of PCT Application No. PCT/US2017/062645 filed on Nov. 20, 2017, which claims the benefit of U.S. Provisional Patent Application No. 62/432,509 filed on Dec. 9, 2016 and U.S. Provisional Patent Application No. 62/486,438 filed on Apr. 17, 20217, each of which is incorporated by reference in its entirety.

BACKGROUND

Memory systems can include a number of dynamic random access memory (DRAM) memory devices to store data. DRAM allows for high density storage, but DRAM is volatile memory and does not retain its data when power is removed.

BRIEF DESCRIPTION OF THE DRAWINGS

The teachings of the embodiments herein can be readily understood by considering the following detailed description in conjunction with the accompanying drawings.

Figure (FIG. 1 is schematic illustration of a memory system, according to one embodiment.

DETAILED DESCRIPTION OF EMBODIMENTS

Reference will now be made in detail to several embodiments of the present disclosure, examples of which are illustrated in the accompanying figures. It is noted that wherever practicable similar or like reference numbers may be used in the figures and may indicate similar or like functionality. The figures depict embodiments of the present disclosure for purposes of illustration only. One skilled in the art will readily recognize from the following description that alternative embodiments of the structures and methods illustrated herein may be employed without departing from the principles, or benefits touted, of the disclosure described herein.

Figure 1:
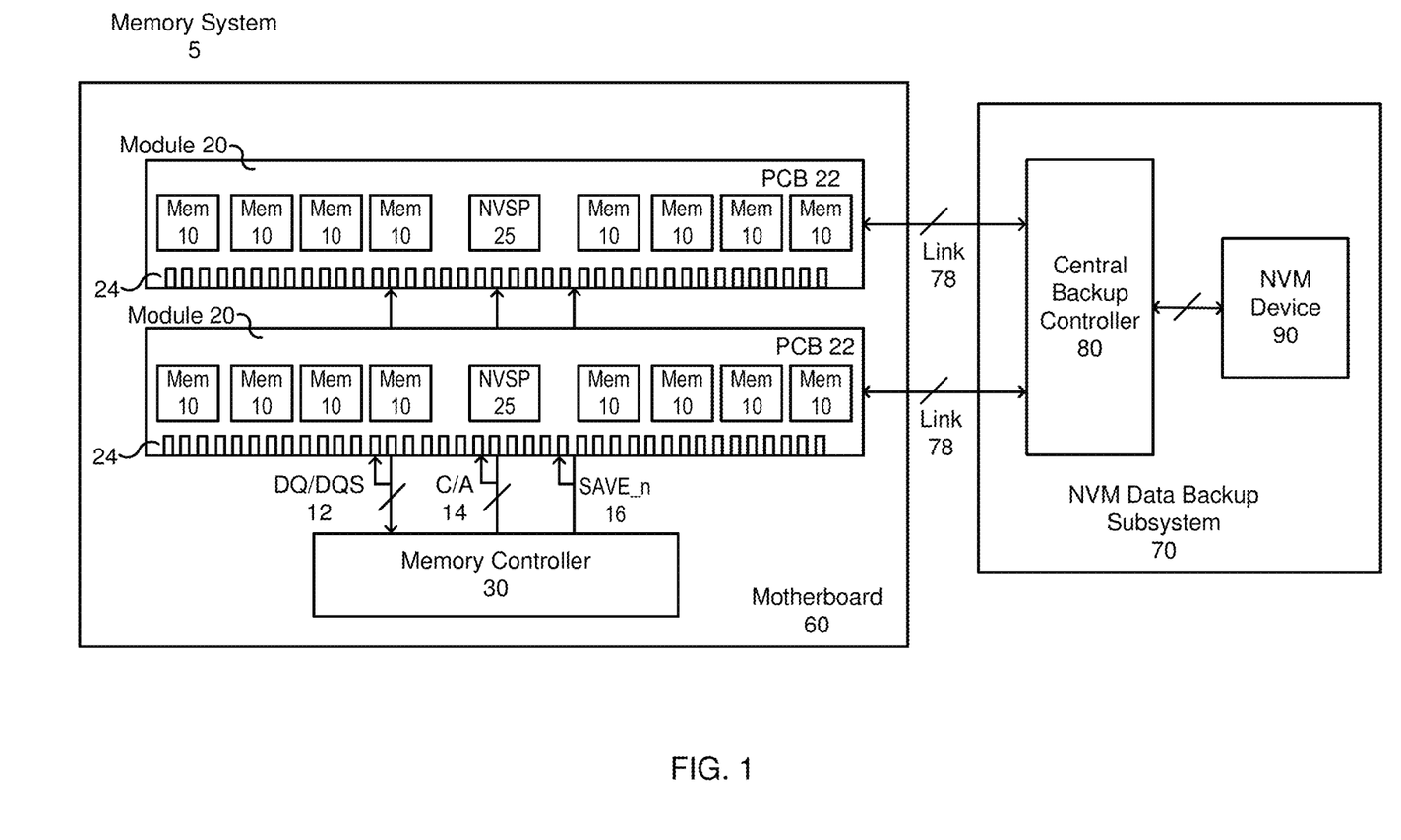

FIG. 1 is schematic illustration of a memory system 5, according to one embodiment. In one embodiment, the memory system 5 represents a computing device such as a server. The memory system 5 includes a motherboard 60. Two memory modules 20 and a memory controller 30 are connected to the motherboard 60. The memory modules 20 may be inserted into memory module sockets of the motherboard 60, and the memory controller 30 may be soldered to the motherboard 60 or connected to a socket of the motherboard 60.

The memory system 5 also includes a non-volatile memory (NVM) data backup subsystem 70. In one embodiment, in the event of a power loss, data in the memory modules 20 is backed up by offloading data from the memory modules 20 to the NVM data backup subsystem 70 and storing the data in the NVM data backup subsystem 70. The data is offloaded by reading data from the DRAM memory packages 10 through backup data ports (not shown in FIG. 1) of the DRAM memory packages 10 and transmitting the data to the NVM data backup subsystem 70. When power is restored, the backed up data is restored by transferring the backed up data from the NVM data backup subsystem 70 to the memory modules 20.

The memory controller 30 and the memory modules 20 are interconnected via a data channel 12 and a command and address (C/A) channel 14. The data channel 12 includes multiple signal lines for carrying data signals (DQ) and data strobe (DQS) signals in parallel between the memory controller 30 and the memory modules 20. The memory controller 30 can read data from and write data to the memory modules 20 via the data channel 12. In one embodiment, the data channel 12 carries 72 DQ signals and 8 DQS signals. The C/A channel 14 includes multiple signal lines for carrying C/A signals such as address signals (ADDR), chip select signals (CS), clock signals (CLK), row address strobe (RAS), column address strobe (CAS) as well as other types of control signals from the memory controller 30 to the memory modules 20.

The memory controller 30 can also detect whether there will or has been a power loss that affects a power supply voltage of the memory system 5. When this occurs, the memory controller 30 transmits a data save signal 16 to the memory modules 20. The data save signal 16 indicates that the data in the memory modules 20 should be saved. The memory modules 20 may each provide the data save signal 16 to the central backup controller 80 through the backup link 78. In some embodiments the memory controller 30 may provide the data save signal 16 directly to the central backup controller 80.

In one embodiment, the memory controller 20 is an integrated circuit (IC) chip that controls the operation of the memory system 10. Examples of a memory controller 20 include a central processing unit (CPU), a graphics processing unit (GPU), a system on chip (SoC), etc.

Each memory module 20 can include a printed circuit board (PCB) 22 and an edge connector 24 located at the edge of the PCB. The edge connector 24 can include multiple conductive pins that form electrical and physical connections with a socket of the motherboard 60. In one embodiment, the memory module 20 can be a dual in line memory module (DIMM). Each memory module 20 includes several DRAM memory packages 10. Each DRAM memory package 10 includes one or more integrated circuits that store data in DRAM memory cells. The DRAM memory cells are volatile and lose their data when power is removed from the DRAM memory packages 10. The DRAM memory packages 10 can include a single DRAM die or multiple dies of DRAM, for example in a stack configuration.

The memory module 20 also includes a non-volatile storage port interface circuit (NVSP) 25. When there is a power loss, the NVSP 25 offloads data from the DRAM memory packages 10 by transferring the data to the NVM data backup subsystem 70 through a corresponding data backup link 78. When power is restored, the NVSP 25 restores the data to the DRAM memory packages 10 by receiving the data from the NV data backup subsystem 70 across the corresponding data backup link 78. The NVSP 25 can be a single integrated circuit, or can be multiple integrated circuits. The NVSP 25 can be implemented with an application specific integrated circuit (ASIC), a programmable logic device (CPLD) or a field programmable gate array (FPGA). Additional details of the memory module 20 and its components will be explained by reference to FIG. 2.

The NVM data backup subsystem 70 includes a central backup controller 80 and a NVM storage device 90. The NVM storage device 90 includes re-writable non-volatile memory cells that store data in a non-volatile manner, and which retain data even when a power supply voltage of the NVM storage device 90 is not present. For example, the non-volatile memory cells can be NAND or NOR based memory cells. The NVM storage device 90 can be, for example, a solid state drive (SSD) or a flash memory chip. In the event of a power loss, the central backup controller 80 receives data from the NVSP 25 and writes the data to the NVM storage device 90, thereby backing up the data from the memory modules 20. When power is restored, the central backup controller 80 reads the backed up data from the NVM storage device 90 and transfers the backed up data to NVSP 25. The central backup controller 80 can be a single integrated circuit or a combination or several integrated circuits.

The NVM data backup subsystem 70 serves as centralized NVM storage that is shared amongst several different memory modules 20. The NVM data backup subsystem 70 is separate from and external to the memory modules 20. By separating the NVM data backup subsystem 70 from the memory modules 20, more DRAM memory packages 10 can be added to a memory module 20 to increase the capacity of the memory modules 20 while still providing data backup capabilities in the event of a power failure. In FIG. 1, the NVM data backup subsystem 70 is shown to be separate from the motherboard 60. In some embodiments, all of or portions of the NVM data backup subsystem 70 can be integrated with the motherboard 60. The NVM data backup subsystem 70 can also include a supercapacitor or battery (not shown) that provides a source of power to the NVM data backup subsystem 70 and memory modules 20 for a short amount of time, even when there is loss of power to the rest of the memory system 5.

Figure 2:
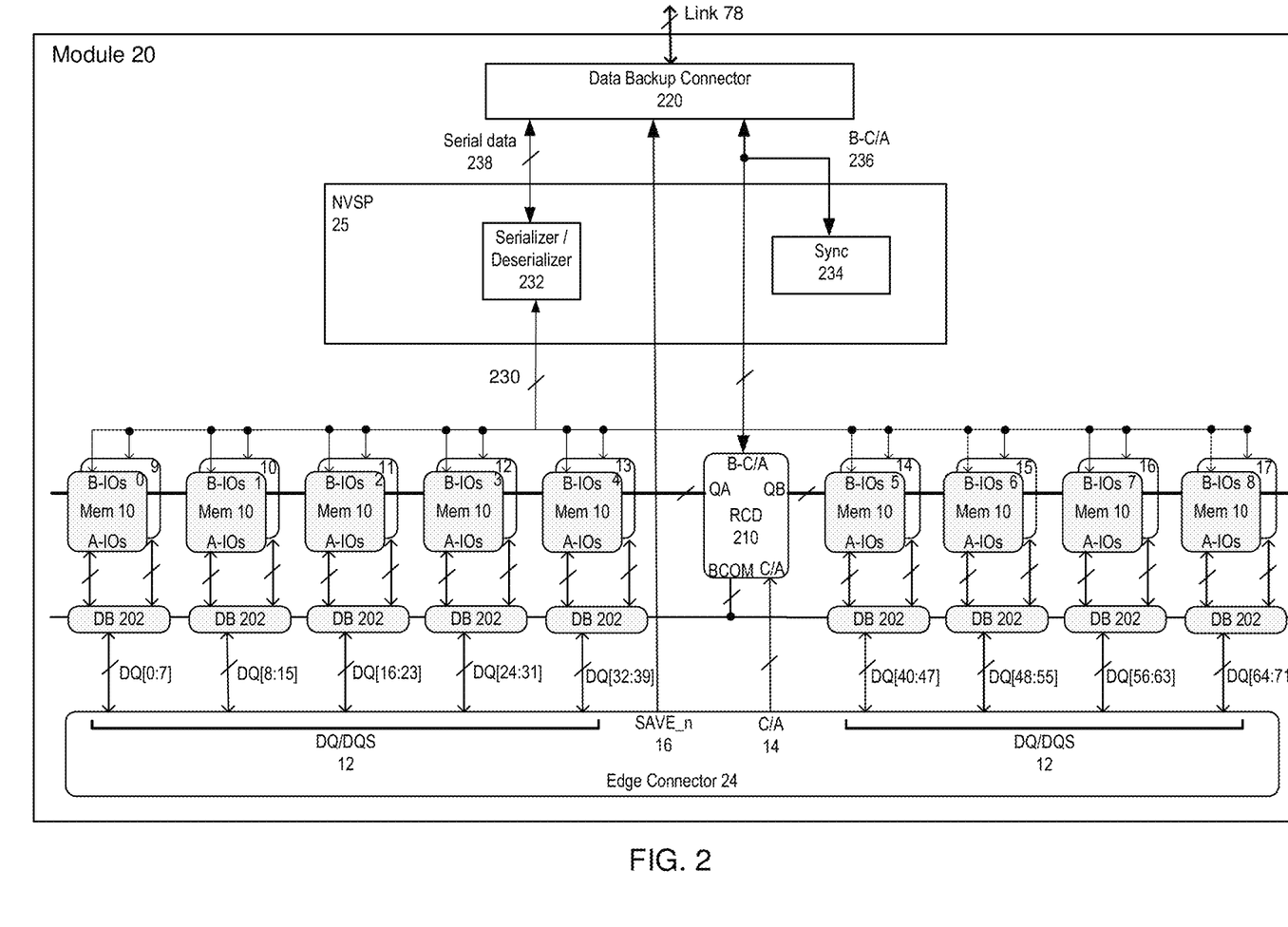
FIG. 2 is a more detailed view of a memory module from FIG. 1, according to an embodiment.

FIG. 2 is a more detailed view of a memory module 20 from FIG. 1, according to an embodiment. The memory module 20 in FIG. 2 can represent any of the memory modules 20 from FIG. 1. As previously described, the memory module 20 includes DRAM memory packages 10, an edge connector 24 and a NVSP 25. In addition, the memory module 20 includes data buffer circuits 202, a registered clock driver (RCD) 210, and a data backup connector 220.

The memory module 20 includes eighteen DRAM memory packages 10 organized into a single 72 bit wide rank of memory controlled by a single chip select signal. Each DRAM memory package 10 includes a primary x4 data port A-IO and a backup x4 data port B-IO. The primary data ports A-IO are used for transferring data with the memory controller 30 (via the data buffers 202, edge connector 24, and primary data channel 12) during normal memory access operations. The backup data ports B-IO are used for transferring data with the NVSP 25 in the event of a power loss, or to restore data that was backed up during a power loss.

Using the backup data ports B-IO for transferring data with the NVSP 25, instead of using the primary data ports A-IO, can reduce the loading on the primary data ports A-IO. Extra loading can cause signal reflections, distort signal integrity, and reduce maximum IO speed. Using the backup data ports B-IO for transferring data with the NVSP 25 allows data and backup and restore capabilities to be added to a memory system 5, without affecting the maximum IO speed of data transferred via the primary data ports A-IO.

In another embodiment the memory module 20 can include more or less than eighteen DRAM memory packages 10. In another embodiment, DRAM memory packages 10 can be organized into more than one memory rank. For example, other embodiments can include two or four ranks of memory packages 10 where each rank is controlled by its own chip select signal. As another example, the DRAM memory packages 10 can be multi-rank memory packages that receive multiple chip select signals.

Figure 3:
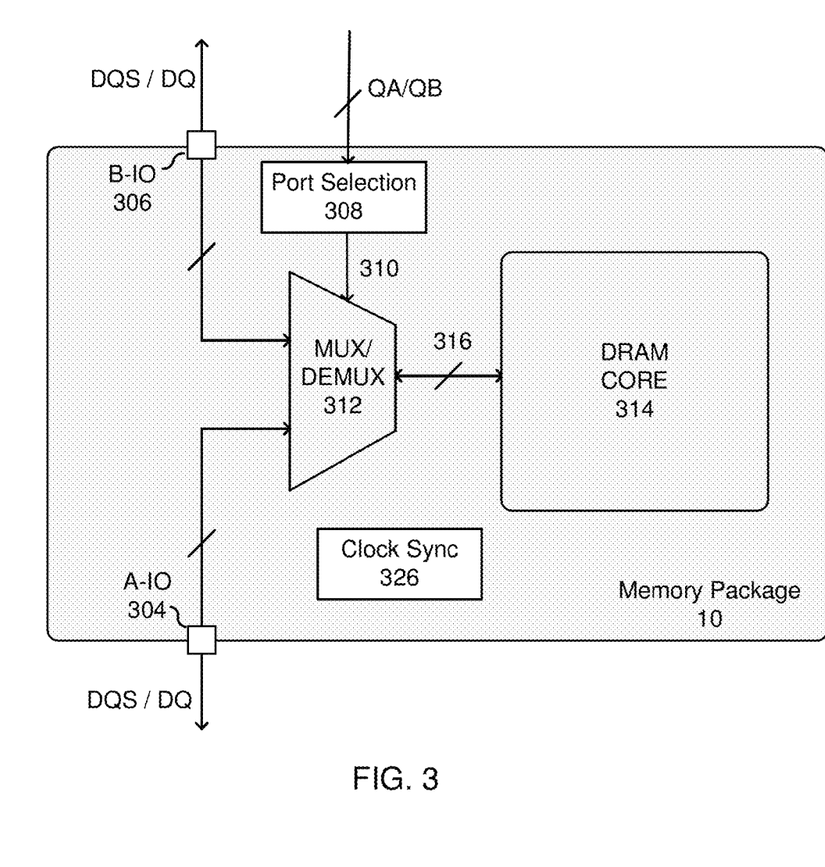
FIG. 3 is more detailed view of a DRAM memory package from FIG. 1, according to an embodiment.

Referring briefly to FIG. 3, illustrated is a more detailed view of a DRAM memory package 10 according to an embodiment. The memory package 10 includes a primary data port A-IO 304, backup data port B-IO 306, port selection circuit 308, multiplexing circuit 312, DRAM core 314 and a clock synchronization circuit 326. The memory package 10 can included one or more IC dies, and the components shown in FIG. 3 can be located on one or more of the dies.

In one embodiment, the primary data port A-IO 304 is a x4 data port that corresponds to four data signals and a data strobe signal. Similarly, the backup data port B-IO 304 is a x4 data port that corresponds to four data signals and a data strobe signal. Each data port can represent the external connection point between the internal circuits of a DRAM memory package 10 and circuits external to the DRAM memory package 10.

The DRAM core 314 includes a large number of DRAM cells organized into banks, rows and columns. Each DRAM cell can store a bit of data in a volatile manner. Data is written to or read from the DRAM core 314 through a data access path 316.

The port selection circuit 308 decodes a control command received via the secondary control and address bus QA or QB and determines, from the control command, whether the primary data port A-IO 304 or secondary data port A-IO 306 is selected for data transfer. The port selection circuit 308 then generates a port selection signal 310 that has a different logic state depending on whether the selected port is port 304 or 306.

The multiplexing circuit 312 selectively couples either the primary data port A-IO 304 or the secondary data port B-IO 306 to the DRAM core 314 through a data access path 316. The multiplexing circuitry couples only one of the primary data port A-IO 304 or the backup data port A-IO 306 to the data access path at a time. The multiplexing circuitry 312 selects between the primary data port A-IO 304 and the secondary data port B-IO 306 under the control of the port selection signal 310. The multiplexing circuitry 312 can include both a multiplexer circuit to route data from a selected data port 304 or 306 to the data access path 316 during write operations. The multiplexing circuitry 312 can also include a de-multiplexing circuit to route data from the data access path 316 to a selected one of the data ports 304 or 306 during read operations.

The clock synchronization circuit 326 receives an input clock and then generates an output clock that is synchronized to the input clock. The output clock is used to control the timing of a DQS signal and data signals transmitted by the DRAM memory package 10 via the primary data port A-IO 304 or secondary data port A-IO 306. Examples of the clock synchronization circuit 326 include a delay locked loop (DLL) or phase locked loop (PLL). In one embodiment, the clock synchronization circuit can be selectively disabled when offloading data from or restoring data to the DRAM memory package 10.

Referring back to FIG. 2, the data buffers 202 are coupled between the DRAM memory packages 10 and the edge connector 24. The data buffers 202 buffer data that is being transferred between the DRAM memory packages 10 and the edge connector 24. The data buffers 202 reduce the loading on the primary data channel 12 so that additional memory ranks can be included in the memory module 20 without increasing the loading on the primary data channel 12. Each data buffer 202 can buffer 8 data DQ signals and one data strobe signal DQS (DQS is not shown in FIG. 2). Each of the data buffers 202 can be an IC chip. During write operations initiated by the memory controller 30, the data buffers 202 receive data signals from the memory controller 30 (via the data channel 12 and edge connector 24) and provide the data signals to the DRAM memory packages 10. During read operations initiated by the memory controller 30, the data buffers 202 receive data signals from the DRAM memory packages 10 and provide the data signals to the memory controller 30 (via the data channel 12 and edge connector 24). In some embodiments, the memory module 20 does not have any data buffers 202 and the primary data ports A-IO are connected directly to the edge connector 24 with signal traces.

The register clock driver RCD 210 is coupled to the edge connector 24, data buffers 202, DRAM memory packages 10, data backup connector 220, and NVSP 25. The registered clock driver RCD 210 receives commands from the memory controller 30 (via the C/A channel 14 and edge connector 24). The registered clock driver RCD 210 transmits those commands to the memory devices 10 through the secondary C/A channels QA and QB. The registered clock driver RCD 210 can control the operation of the data buffers 202 through the buffer command BCOM channel. The registered clock driver RCD 210 can also receive commands through the backup C/A channel 236 in the event of a power loss and control the DRAM memory packages 10 and data buffers 202 according to those commands. The registered clock driver RCD 210 can be an IC chip. In one embodiment, the RCD 210 may be referred to as a C/A buffer circuit.

The data backup connector 220 represents a physical connector that is used to connect the memory module 20 to the data backup link 78. The data backup connector 220 can be a ribbon cable connector that has a physical structure that is configured to connect to an end of a ribbon cable. In this situation the backup link 28 represents a ribbon cable. Alternatively, the data backup connector 220 can be integrated into the edge connector 24. In this situation the data backup link 28 represents traces of the motherboard 60.

The data backup link 78 can include several wires that carry different types of signals. The data backup link 78 can includes wires for a serial link 238. In one embodiment, the serial link 238 is a PCI-express link, a serial ATA (SATA) link, or another type of communication link. The data backup link 78 can include additional wires for a backup C/A channel 236. The data backup link 78 can also include an additional wire for the data save signal 16.

The NVSP 25 provides an interface between the DRAM memory packages 10 and the NVM data backup subsystem 70. The NVSP 25 includes a serializer/deserializer circuit 232 and a synchronization circuit 234. The NVSP interface circuit 30 is coupled to the backup data ports B-IOs of the memory devices 10 via the backup data channel 230. The backup data channel 230 is a multi-bit parallel data channel similar to the primary data channel 12. The NVSP 25 is also coupled to data backup connector 220 through the serial link 238 and the backup C/A channel 236.

In the event of a power loss, the serializer/deserializer circuit 232 receives data from the DRAM memory packages 10 through the backup data ports B-IOs, serializes the data, and then transmits the serialized data to the NVM data backup sub-system 70 via the serial link 238. When power is restored, the serializer/deserializer circuit 232 receives the backed up data from the NVM data backup sub-system 70 via the serial link 238, deserializes the data, and writes the deserialized data to the DRAM memory packages 10 through the backup data ports B-IOs.

The synchronization circuit 234 aligns memory access commands on the backup C/A channel 236 with the data written to the DRAM memory packages 10. For example, a known command to data relationship (e.g. DRAM write latency) may required between the time a memory access command arrives at the DRAM memory packages 10 and when data can be written to the DRAM memory packages 10. The synchronization circuit 234 can set the delay with which data is written to the DRAM memory packages 10 to ensure that the relationship is met.

Figure 4:
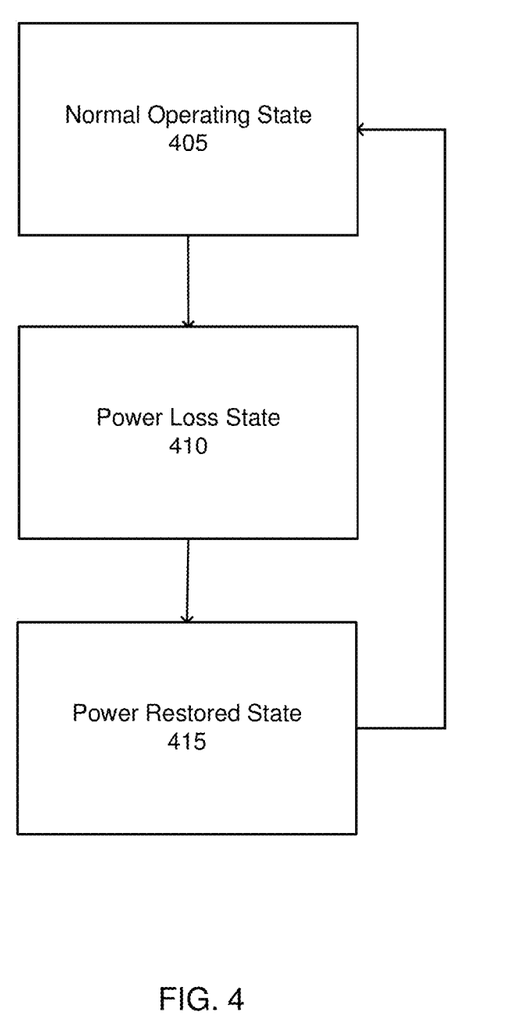
FIG. 4 is flowchart illustrating states of operation in the memory system, according to an embodiment.

FIG. 4 is flowchart illustrating states of operation in the memory system, according to an embodiment. The first state is the normal operating state 405. During the normal operating state 405, the power supply voltages in the memory system 5 are at their proper and stable levels. The registered clock driver RCD 210 receives commands from the memory controller 30 through the primary C/A channel 14, and controls the data buffers 202 and DRAM memory packages 10 in accordance with those commands. The memory controller 30 also writes data to and reads data from the DRAM memory packages 10 through the primary data channel 12. The data buffers 202 are powered on and buffer data between the primary data ports A-IO of the DRAM memory packages 10 and the memory controller 30.

The second state is the power loss state 410. The power loss state 410 occurs when the memory controller 30 detects that there has been or will be a loss of power in the memory system 5. For example, a power loss can be detected with a power monitoring circuit that monitors the state of a power supply voltage (e.g. 12V, 5V) and compares the power supply voltage to a threshold. The power loss can be an un-planned power loss that is occurring as a result of a hardware failure. When a power loss is detected, the memory controller 30 asserts the memory save signal SAVE_N to indicate that there is a power loss and that the data in the DRAM memory packages 10 needs to be offloaded. The memory save signal SAVE_N 16 is provided to the memory module 20, which then passes the signal on to the central backup controller 80.

Upon receiving the memory save signal SAVE_N 16, the central backup controller 80 sends one or more initial backup commands to the memory module 20 across the data backup link 78, such as through the backup C/A channel 236. In response to these commands, the registered clock driver RCD 210 stops accepting commands from the primary C/A channel 14. The commands also cause the DRAM memory packages 10 to disable their primary data ports A-IOs and to enable their backup data ports B-IOs. For example, the commands can cause the multiplexing circuit 312 to selectively connect backup data port 306 to the data access path 316 but to disconnect primary data port 304 from the data access path 316.

The commands can cause the registered clock driver RCD 210 to turn off the data buffers 202. Turning off the data buffers 202 can involve placing the data buffers 202 into clock stopped power down mode. The commands can also cause the DRAM memory packages 10 to turn off their internal clock synchronization circuits 326. Turning off the data buffers 202 and the clock synchronization circuits 326 reduces the power consumed by the memory module 20 in the event of a power loss. In one embodiment, the RCD 210 can turn off the data buffers 202 or turn off the clock synchronization circuits 326 in response to commands from the memory controller 30.

The central backup controller 80 then sends read commands to the memory module 20 across the link 78, such as through the backup C/A channel 236. The NVSP 25 of a memory module 20 receives data from the DRAM memory packages 10 through the backup data ports B-IO, serializes the data, and transmits the serialized data to the central backup controller 80. The central backup controller 80 receives the data through the data backup link 78 and then writes the data into the NVM device 90, thereby saving and backing up the data.

The central backup controller 80 can retrieve data concurrently from all of the memory modules 20 at once. Alternatively, data can be retrieved from one memory module 20 before data is retrieved from the next memory module 20.

The third state is the power restored state 415. The power restored state 415 begins when the central backup controller 80 detects that power has been restored to the memory system 5. Once power has been restored, the central backup controller 80 reads the backed up data from the NVM device 90 and sends the backed up data to the appropriate memory module 20 (via the serial link 238 of the data backup link 78), and sends one or more memory write commands to the memory module 20 (via the backup C/A channel 236 of the data backup link 78). The NVSP interface circuit 30 receives the backed up data and transmits the data to the DRAM memory packages 10 through the backup data ports B-IO. As a result, the data in the DRAM memory packages 10 is fully restored to its state before power was lost. This process can be repeated for each memory module 20 until all the backed up data and restored to all of the memory modules 20. The data buffers 202 and the clock synchronization circuits 326 can also be turned off when restoring data to reduce power consumption.

In one embodiment, a system comprise a NVM data backup subsystem including non-volatile memory. The system also comprises a plurality of memory modules that are separate from the NVM data backup subsystem. At least one memory module comprises a plurality of random access memory packages. Each random access memory package including a primary data port and a backup data port. The memory module also comprises a storage interface circuit coupled to the backup data ports of the random access memory packages. The storage interface circuit offloads data from the memory module in the event of a power loss by receiving data from the backup data ports of the random access memory packages and transmitting the data to the non-volatile memory subsystem that is external to and separate from the memory module.

In one embodiment, a representation of components described herein may be stored as data in a non-transitory computer-readable medium (e.g. hard disk drive, flash drive, optical drive). These representations may in the form of, for example, behavioral level descriptions, register transfer level descriptions, logic component level descriptions, transistor level descriptions or layout geometry-level descriptions.

Upon reading this disclosure, those of skill in the art may appreciate still additional alternative designs for data backup in a memory system. Thus, while particular embodiments and applications of the present disclosure have been illustrated and described, it is to be understood that the disclosure is not limited to the precise construction and components disclosed herein. Various modifications, changes and variations which may be apparent to those skilled in the art may be made in the arrangement, operation and details of the method and apparatus of the present disclosure herein without departing from the spirit and scope of the disclosure as defined in the appended claims.

What is claimed is:

1. A memory controller comprising:
a first communication interface coupled to a memory module that includes a plurality of random access memory devices configured to store data, the memory controller configured to read data from and write data to the memory module via the first communication interface; and
a second communication interface coupled to the memory module, the second communication interface configured to transmit a signal to the memory module to backup the data stored in the plurality of random access memory devices responsive to the memory controller detecting a power loss that affects a power supply voltage of the memory module.

2. The memory controller of claim 1, further comprising:
a power monitoring circuit configured to monitor a state of a power supply that supplies the power supply voltage by comparing the power supply voltage to a threshold,
wherein the memory controller is configured to assert the signal on the second communication interface based on the comparison.

3. The memory controller of claim 2, wherein the power loss is a future power loss.

4. The memory controller of claim 2, wherein the power loss in an un-planned power loss resulting from a hardware failure at the power supply.

5. The memory controller of claim 1, wherein the signal to backup the data is forwarded by the memory module to a non-voltage memory (NVM) data backup subsystem that is separate from the memory module, and the memory module is configured to reconfigure primary data ports and backup data ports of a plurality of random access memory packages included in the plurality of random access memory devices such that the data is offloaded from the memory module to the NVM data backup subsystem via the backup data ports responsive to the memory module receiving a backup command from the NVM data backup subsystem, the backup command received by the memory module responsive to the NVM data backup subsystem receiving the signal forwarded by the NVM data backup subsystem.

6. The memory controller of claim 5, wherein the memory controller reads data from the memory module via the primary data ports.

7. The memory controller of claim 1, wherein the signal to backup the data is provided directly to a non-voltage memory (NVM) data backup subsystem that is separate from the memory module, and the memory module is configured to reconfigure primary data ports and backup data ports of a plurality of random access memory packages included in the plurality of random access memory devices such that the data is offloaded from the memory module to the NVM data backup subsystem via the backup data ports responsive to the memory module receiving a backup command from the NVM data backup subsystem, the backup command received by the memory module responsive to the NVM data backup subsystem receiving the signal from the memory controller.

8. The memory controller of claim 1, wherein the memory controller and the memory module are connected to a motherboard such that the memory controller, the memory module, and the motherboard collectively form a memory system.

9. The memory controller of claim 1, wherein the signal further instructs the memory module to turn off at least one of data buffers or clock circuits included in the memory module.

10. A method of operation of a memory controller comprising:
    reading data from and write data to a memory module via a first communication interface of the memory controller; and
    transmitting a signal to the memory module via a second communication interface of the memory controller to backup data stored in a plurality of random access memory devices included in the memory module responsive to the memory controller detecting a power loss that affects a power supply voltage of the memory module.

11. The method of claim 10, wherein the power loss is a future power loss.

12. The method of claim 10, wherein the power loss in an un-planned power loss resulting from a hardware failure at the power supply.

13. The method of claim 10, wherein the signal to backup the data is forwarded by the memory module to a non-voltage memory (NVM) data backup subsystem that is separate from the memory module, and the memory module is configured to reconfigure primary data ports and backup data ports of a plurality of random access memory packages included in the plurality of random access memory devices such that the data is offloaded from the memory module to the NVM data backup subsystem via the backup data ports responsive to the memory module receiving a backup command from the NVM data backup subsystem, the backup command received by the memory module responsive to the NVM data backup subsystem receiving the signal forwarded by the NVM data backup subsystem.

14. The method of claim 10, wherein the signal to backup the data is provided directly to a non-voltage memory (NVM) data backup subsystem that is separate from the memory module, and the memory module is configured to reconfigure primary data ports and backup data ports of a plurality of random access memory packages included in the plurality of random access memory devices such that the data is offloaded from the memory module to the NVM data backup subsystem via the backup data ports responsive to the memory module receiving a backup command from the NVM data backup subsystem, the backup command received by the memory module responsive to the NVM data backup subsystem receiving the signal from the memory controller.

15. The method of claim 13, wherein the data is read from the memory module via the primary data ports.

16. The method of claim 10, wherein the signal further instructs the memory module to turn off at least one of data buffers or clock circuits included in the memory module.

17. A memory controller comprising:
    a first communication means coupled to a memory module that includes a plurality of random access memory devices configured to store data, the memory controller configured to read data from and write data to the memory module via the first communication means; and
    a second communication means coupled to the memory module, the second communication means configured to transmit a signal to the memory module to backup the data stored in the plurality of random access memory devices responsive to the memory controller detecting a power loss that affects a power supply voltage of the memory module.

18. The memory controller of claim 17, further comprising:
    a power monitoring means configured to monitor a state of a power supply that supplies the power supply voltage by comparing the power supply voltage to a threshold,
    wherein the memory controller is configured to assert the signal on the second communication means based on the comparison.

19. The memory controller of claim 17, wherein the power loss is a future power loss.

20. The memory controller of claim 17, wherein the power loss in an un-planned power loss resulting from a hardware failure at the power supply.

* * * * *